(12) United States Patent
De Vita et al.

(10) Patent No.: US 8,902,008 B1
(45) Date of Patent: Dec. 2, 2014

(54) RESISTOR CAPACITOR (RC) OSCILLATOR

(75) Inventors: Giuseppe De Vita, Pavia (IT);
Alessandro Savo, Pavia (IT)

(73) Assignee: Marvell International Ltd., Hamilton (BM)

( * ) Notice: Subject to any disclaimer, the term of this patent is extended or adjusted under 35 U.S.C. 154(b) by 143 days.

(21) Appl. No.: 13/548,670

(22) Filed: Jul. 13, 2012

Related U.S. Application Data (63) Continuation of application No. 12/713,069, filed on Feb. 25, 2010, now Pat. No. 8,232,846.

(60) Provisional application No. 61/156,725, filed on Mar. 2, 2009.

(51) Int. Cl.
*H03K 3/26* (2006.01)

(52) U.S. Cl.
USPC .......................... 331/111; 331/143; 331/113 R (58) Field of Classification Search
CPC . H03K 3/012; H03K 3/02315; H03K 3/0233; H03K 3/356113; H03K 5/08; H03K 5/133; H03K 5/1515; H03K 5/1534; H03K 5/2472; H03K 5/249; H03L 1/00; H03L 1/022; H03L 7/00; H03L 7/02; H03L 7/097; H03L 7/099; H03L 7/0891; H03L 7/181
USPC ...................................... 331/111, 113 R, 143
See application file for complete search history.

(56) References Cited

U.S. PATENT DOCUMENTS

| | | |
|---|---|---|
| 7,109,804 B2 * | 9/2006 | Mader et al. ..................... 331/16 |
| 7,733,191 B2 | 6/2010 | Olmos et al. |
| 8,067,992 B2 | 11/2011 | Chen et al. |
| 8,232,846 B1 * | 7/2012 | De Vita et al. ................ 331/111 |

* cited by examiner

*Primary Examiner* — Arnold Kinkead (57) ABSTRACT

Aspects of the disclosure provide a circuit. The circuit includes a current generator, a capacitor, a comparator, a switch and a clock generator logic. The current generator is configured to generate a current proportional to a comparator threshold voltage by a ratio. The capacitor is configured to be charged by the current to have a capacitor voltage. The comparator is configured to compare the capacitor voltage with the comparator threshold voltage. The switch is configured to discharge the capacitor based on the comparison. The clock generator logic is configured to generate a clock signal based on the comparison, such that a frequency of the clock signal is a function of the ratio and is independent of the current and the comparator threshold voltage.

17 Claims, 10 Drawing Sheets

RESISTOR CAPACITOR (RC) OSCILLATOR

CROSS REFERENCE TO RELATED APPLICATIONS

This application is a continuation of U.S. patent application Ser. No. 12/713,069, now U.S. Pat. No. 8,232,846, "Resistor Capacitor (RC) Oscillator" filed on Feb. 25, 2010, which claims priority to U.S. Provisional App. No. 61/156,725, "RC Oscillator" filed on Mar. 2, 2009. The entire disclosures of the above-identified applications are incorporated herein by reference in their entirety.

BACKGROUND

Particular embodiments generally relate to resistor capacitor (RC) oscillators.

Unless otherwise indicated herein, the approaches described in this section are not prior art to the claims in this application and are not admitted to be prior art by inclusion in this section.

Generation of a high-accuracy clock signal is important for the operation of both digital blocks and many analog circuits, such as charge pumps, buck regulators, analog-to-digital converters (ADCs), digital-to-analog converters (DACs), and chopper amplifiers. One way to generate a high-accuracy clock signal is to use a phase lock loop (PLL) with a crystal oscillator to provide the reference frequency. The problem is that this solution is very expensive in cost because it requires an external crystal for the crystal oscillator. In terms of chip area and power, this solution is also expensive because of the implementation of the PLL. As a consequence, the solution is used only in cases where a very high accuracy and low jitter clock is required, such as in high resolution ADCs and DACs.

Figure 1:
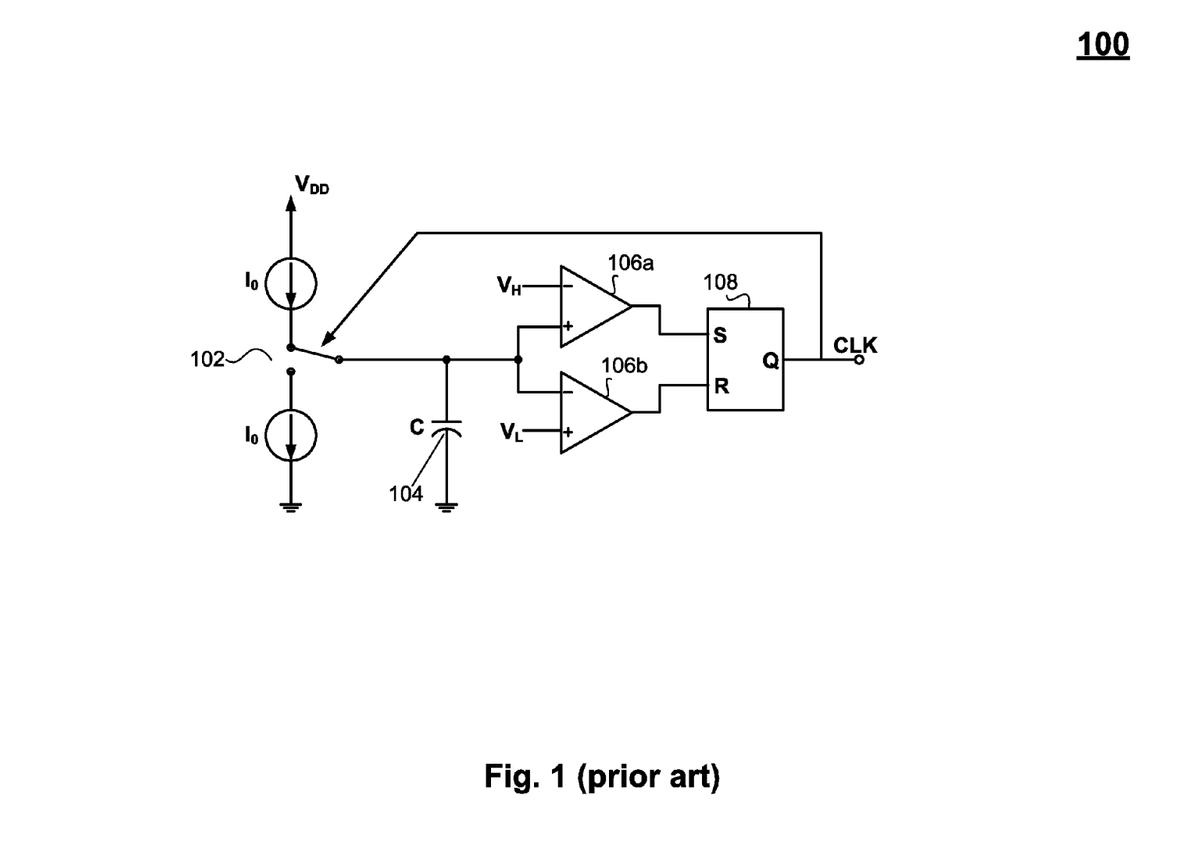
FIG. 1 shows an example of a conventional relaxation oscillator.

In other applications, an RC oscillator is used. In one example, an RC oscillator is a relaxation oscillator. A relaxation oscillator is an RC oscillator that is based upon the behavior of the oscillator's return to equilibrium after being perturbed. FIG. 1 shows an example of a conventional relaxation oscillator 100. When a switch 102 is in a high position as shown in FIG. 1, a capacitor 104 is charged with a constant current $I_0$. As soon as a voltage, $V_c$, across capacitor 104 reaches a threshold voltage $V_H$, the output of a comparator 106a goes high. In a set reset (SR) latch 108, the SR latch is set and the position of switch 102 is reversed to the low position.

As a consequence, capacitor 104 is discharged with the current $I_0$ and when the voltage across capacitor 104 reaches a threshold voltage $V_L$, the output of comparator 106b goes high. The SR latch 108 is reset and the position of switch 102 is reversed again to the high position. This causes an output clock frequency (CLK) from SR latch 108 of:

$$f = \frac{I_0}{2C(V_H - V_L)}.$$

Figure 2:
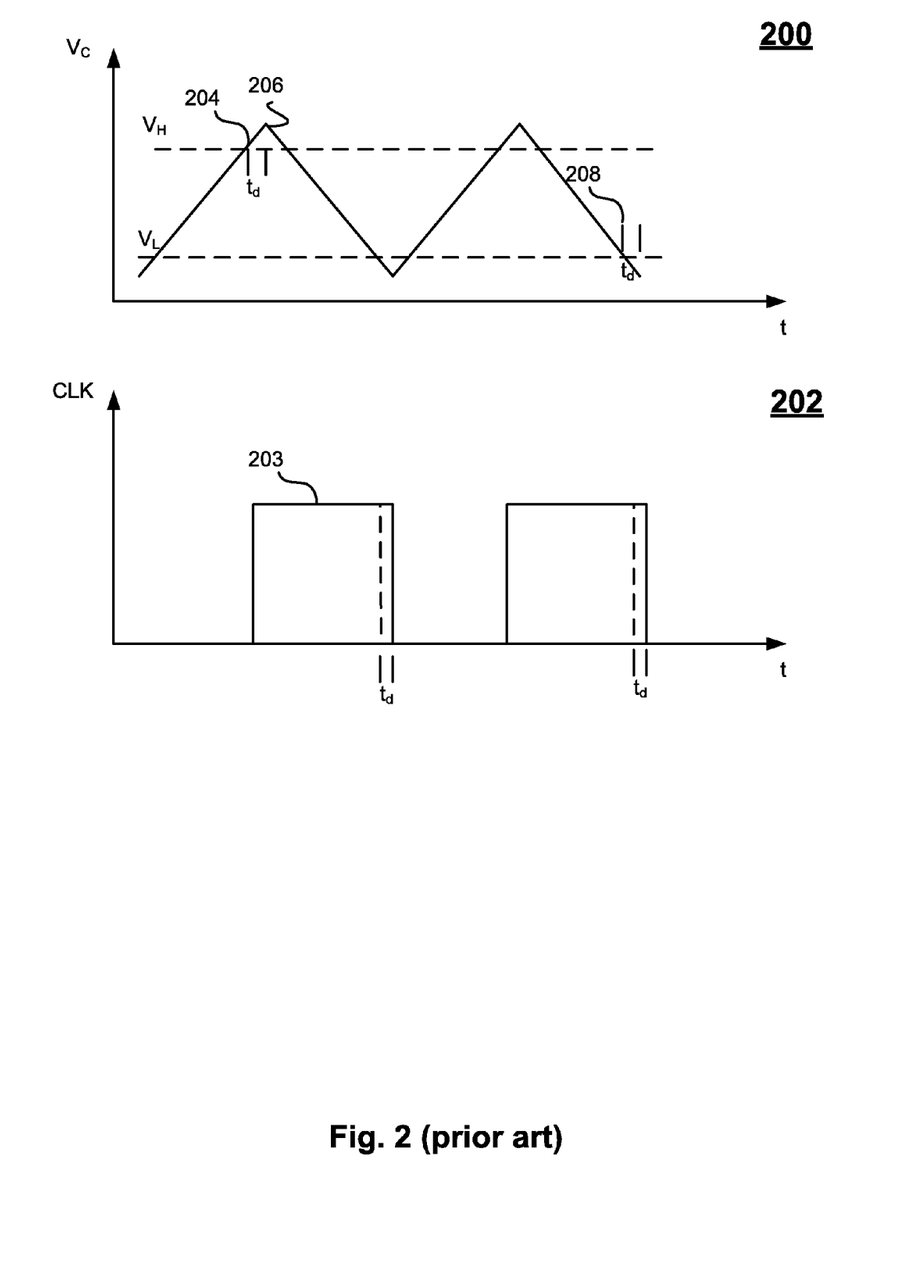
FIG. 2 shows waveforms for the oscillator of FIG. 1.

FIG. 2 shows waveforms for conventional oscillator 1-100. A graph 200 shows a waveform 201 of the voltage, $V_C$, across capacitor 104 over time. A graph 202 shows a clock signal (CLK) 203 that is generated. At a point 204, the voltage across capacitor 104 reaches $V_H$. At this point, the clock signal should go high. However, due to a delay of comparator 106a, at a point 206, comparator 106a goes high and then the clock signal goes low. A delay of $t_d$ from an ideal clock frequency results.

At a point 208, the voltage across capacitor 104 has hit the lower threshold voltage $V_L$. There may be time variation $t_d$ due to a delay of comparator 106b that may cause comparator 106b to go low with a certain amount of delay. This causes the output clock frequency go low with a delay $t_d$ also. This results in a lower frequency compared to an ideal frequency of a clock signal shown in dotted lines.

Figure 3:
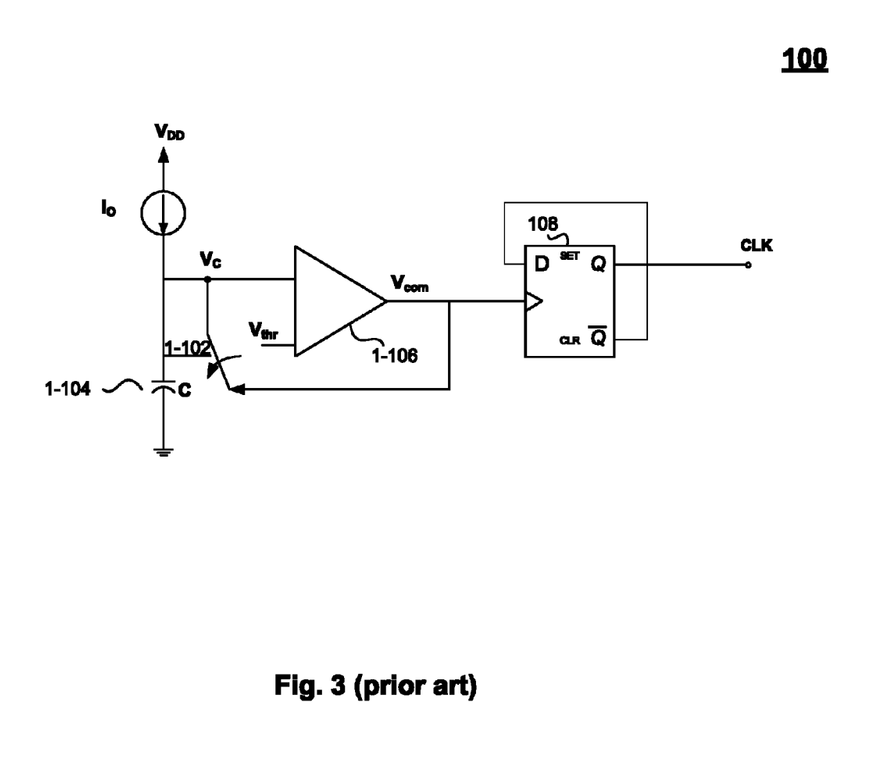
FIG. 3 shows another example of the oscillator.

FIG. 3 shows another example of a conventional relaxation oscillator 1-100. In this example, a single comparator 1-106 is used. In this case, when switch 1-102 is open, capacitor 1-104 is charged. When the voltage, $V_c$, across capacitor 1-104 reaches $V_{thr}$, then the output of comparator 1-106 goes high. Switch 1-102 is then closed and capacitor 1-104 is discharged. When capacitor 1-104 is discharged, the output of comparator 1-106 goes low, and switch 1-102 is open. Comparator 1-106 outputs a series of impulses. A D flip flop 108 receives the impulses and outputs a 50% duty cycle clock signal (CLK) with the output frequency of:

$$f = \frac{I_0}{2C(V_{thr})}$$

Figure 4:
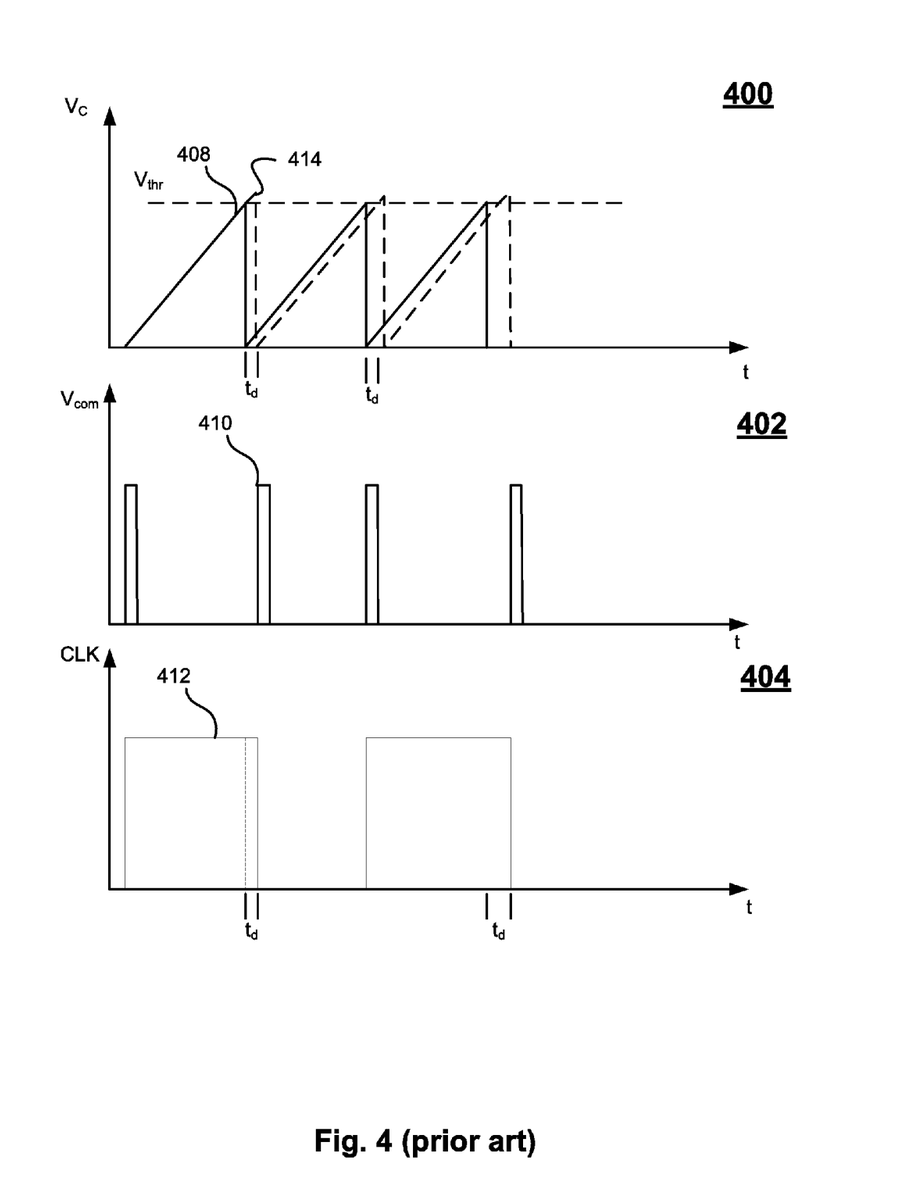
FIG. 4 shows an example of waveforms of oscillator of FIG. 3.

FIG. 4 shows an example of waveforms of oscillator 1-100 of FIG. 3. In a graph 400, a waveform 408 for the voltage ($V_C$) across capacitor 1-104 is shown. In a graph 402, a waveform 410 the output of comparator 1-106 is shown. A clock signal (CLK) 412 is shown in graph 404. When the voltage across capacitor 1-104 reaches $V_{thr}$, the output of comparator 1-106 should go high. When the switch is closed and capacitor 1-104 is quickly discharged, the output of comparator 1-106 goes low. Thus, a sequence of impulses is provided in graph 402 where a 50% duty cycle clock signal is output.

Because of the delay of comparator 1-106, the frequency of the clock signal is lower than the ideal frequency. For example, a delay $t_d$ shown at 414 causes comparator 1-106 to go high with a delay, which causes a delay $t_d$ in the clock frequency going low. This results in a lower frequency compared to an ideal frequency of a clock signal shown in dotted lines.

Accordingly, one of the problems with oscillators 1-100 is that the delay of comparator(s) 106 affects the clock frequency. This delay varies with the process, temperature and supply voltage. The clock frequency is dependent on the threshold voltage of the comparator(s). The equations for the frequency above include the value of the threshold voltages for comparator(s) 106. Thus, as the threshold voltages exhibit a process, temperature, and supply voltage sensitivity, the output clock frequency also varies. The sensitivity may be reduced by designing a fast comparator to reduce the delay but the power consumption increases a lot in this case, especially with the use of high frequency clocks.

Another problem of relaxation oscillator 1-100 is that it requires a constant current $I_0$, but the constant current varies with process, temperature, and supply voltage variations. In order to generate a constant current independent of process, temperature, and supply voltage variations, it is necessary to have a bandgap and an external resistor, $R_{ext}$. A bandgap is a circuit that generates a precise voltage. The external resistor is external to a chip including oscillator 1-100. The external resistor is needed because integrated resistors may have large variations with process and temperature. The current generated is $I_0 = V_{BG}/R_{ext}$, where $V_{BG}$ is the voltage generated by the bandgap. The bandgap is also required to generate precise thresholds $V_H$ and $V_L$, or $V_{thr}$. Thus, to implement relaxation oscillator 1-100, a fast comparator, a bandgap, and an external resistor are required. which increases cost and complexity.

Other solutions exist in which the output clock frequency is independent of the delay of comparators 106 of FIGS. 1 and 3. However, this requires increased circuit complexity, which raises cost. Further, an op-amp always needs to be used as a comparator 1-106 because threshold voltages are compared with the voltage across capacitor 1-104. Consequently, relaxation oscillators 1-100 are expensive in terms of power because they require at least a high gain op-amp and a bandgap, and in terms of cost, because they require an external resistor.

SUMMARY

In one embodiment, an RC oscillator is provided. The oscillator includes a current generator circuit configured to generate a current. A capacitor is configured to be charged by the current. An inverter includes an input coupled to the capacitor. An output of the inverter goes high when a voltage across the capacitor reaches a threshold voltage of the inverter. A switch coupled to the output of the inverter and the capacitor is configured to close when the output of the inverter goes high. This discharges the capacitor. The output of the inverter goes low when the capacitor is discharged and the switch is opened. Clock generator logic is configured to receive the output of the inverter and generate a clock signal. The current is proportional to the threshold voltage of the inverter.

In one embodiment, an apparatus is provided comprising: a current generator circuit configured to generate a current; a capacitor configured to be charged by the current; an inverter including an input coupled to the capacitor, wherein an output of the inverter goes to a first level when a voltage across the capacitor reaches a threshold voltage of the inverter; a switch coupled to the output of the inverter and the capacitor, the switch configured to move from a first position to a second position when the output of the inverter goes to the first level thereby discharging the capacitor, wherein the output of the inverter goes to a second level when the capacitor is discharged thereby causing the switch to move to the first position; and clock generator logic configured to receive the output of the inverter and generate a clock signal, wherein the current is proportional to the threshold voltage of the inverter.

In one embodiment, a clock frequency of the clock signal is dependent a resistance value of a resistor of the current generator circuit and a capacitance value of the capacitor.

In one embodiment, the current is proportional to the threshold voltage divided by the resistance value.

In another embodiment, an apparatus is provided comprising: a current generator circuit comprising: a first transistor; a second transistor coupled to a gate of the first transistor; a first inverter having an output coupled to a gate of the second transistor, the first inverter having a first threshold voltage; and a resistor coupled to an input of the inverter and a source of the first transistor, wherein a current generated by the current generator circuit is equal to the first threshold voltage of the first inverter divided by a resistance of the resistor; a capacitor configured to be charged by the current generated by the current generator circuit; a second inverter including an input coupled to the capacitor, wherein an output of the second inverter goes high when a charge of the capacitor reaches a second threshold voltage of the second inverter, the second threshold voltage being substantially similar to the first threshold voltage; a switch coupled to the output of the second inverter and the capacitor, the switch configured to move to a first position when the output of the second inverter goes to a first level thereby discharging the capacitor, wherein the output of the second inverter goes to a second level when the capacitor is discharged and the switch is moved to a second position; and clock generator logic configured to receive the output of the second inverter and generate a clock signal.

In another embodiment, a method is provided comprising: generating a current; charging a capacitor based on the current; outputting, using an inverter, a first signal when a voltage across the capacitor reaches a threshold voltage of the inverter; changing a state of a switch to a first state when the inverter outputs the first signal to discharge the capacitor; outputting, using the inverter, a second signal when the capacitor is discharged; changing the state of the switch to a second state when the inverter outputs the second signal; and generating a clock signal using the output of the first signal and the second signal of the inverter, wherein the current is proportional to the threshold voltage of the inverter.

In one embodiment, a clock frequency of the clock signal is dependent a resistance value of a resistor used to generate the current and a capacitance value of the capacitor.

In one embodiment, the current is proportional to the threshold voltage divided by the resistance value.

In one embodiment, generating the current includes generating the current with compensation for temperature variations of a resistor used in a circuit to generate the current.

The following detailed description and accompanying drawings provide a better understanding of the nature and advantages of the present invention.

BRIEF DESCRIPTION OF THE DRAWINGS

FIG. 513 shows waveforms of the operation of RC oscillator according to one embodiment.

DETAILED DESCRIPTION

Described herein are techniques for an RC oscillator. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 5A:
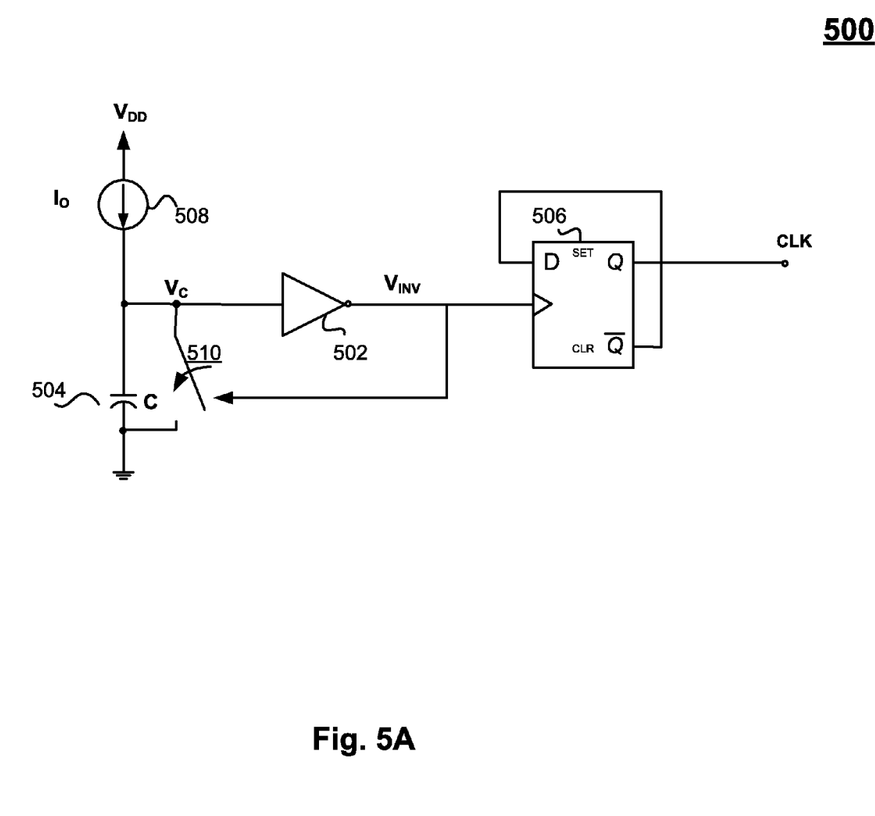
FIG. 5A depicts an RC oscillator according to one embodiment.

FIG. 5A depicts an RC oscillator 500 according to one embodiment. RC oscillator 500 includes an inverter 502, a capacitor 504, a flip-flop 506, a current generation circuit 508, and a switch 510.

In one embodiment, a chip including RC oscillator 500 provides a low power and low cost oscillator that uses inverter 502 and no external. Instead of generating a constant current and a precise threshold that are both independent of process, temperature, and supply voltage, a current proportional to a threshold of inverter 502 is generated such that an output clock frequency (CLK) becomes independent of the threshold because the current follows variations of the threshold with process, temperature, and supply voltage. Consequently, a precise threshold is not needed (and a bandgap) and also a conventional op-amp to implement the comparator is not needed. Rather, particular embodiments use an inverter as the comparator.

In one embodiment, a current is $I_0 \propto V_{THR}/R$, where $V_{THR}$ is a threshold voltage of inverter 502 and R is a resistance of an internal resistor of current generation circuit 508 (not shown—described below). The current $I_0$ generated in current generation circuit 508 is:

$$I_0 = \frac{V_{THR}}{R}$$

The current is mirrored to charge the capacitor 504. The frequency may be determined using:

$$T_0 = \frac{C}{I_0} V_{THR}; f_0 = \frac{1}{2T_0} = \frac{I_0}{2CV_{THR}}$$

where $T_0$ is the half period of a 50% duty cycle clock signal. Using $I_0 = V_{THR}/R$ in the expression shown above, the frequency can be re-written as follows, $$f_0 = \frac{1}{2T_0} = \frac{I_0}{2CV_{THR}} = \frac{1}{2RC}.$$

Accordingly, the current is proportional to the threshold voltage of inverter 502 and inversely proportional to the internal resistor. This makes the clock frequency $f \propto 1/RC$. Thus, the clock frequency is inversely proportional to the internal resistor and capacitor and does not depend on the voltage threshold of inverter 502.

In operation, the current $I_0$ charges capacitor 504. As soon as the voltage across capacitor 504 ($V_C$) reaches the threshold voltage, $V_{THR}$, of inverter 502, the output of inverter 502 goes high and switch 510 is closed. Capacitor 504 is then quickly discharged. Once capacitor 504 is discharged, the output of inverter 502 goes low and switch 510 is released. The output ($V_{INV}$) of inverter 502 is a sequence of impulses and the output of clock generation logic, such as a D flip-flop 506, is a 50% duty cycle clock signal (CLK). Other clock generation logic may also be used.

Capacitor 504 is discharged very fast such that the discharge time is negligible with respect to the period of the clock signal. This means that switch 510 is big enough such that the time constant between the on resistance of switch 510 and capacitor 504 is much smaller than the period of the clock signal.

The clock frequency is $$f = \frac{1}{2RC}.$$

Figure 5B:
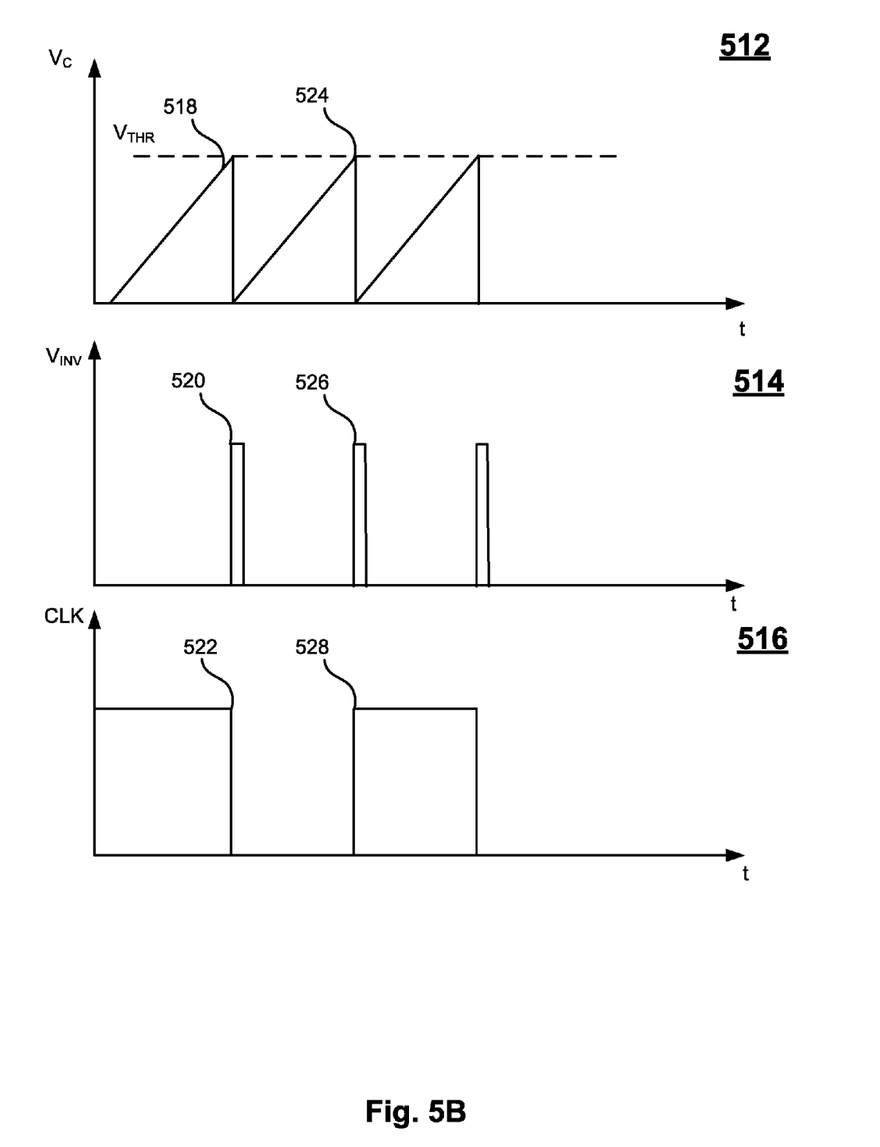

FIG. 5B shows waveforms of the operation of RC oscillator 5-500 according to one embodiment. In the graph 512, the voltage $V_C$ across the capacitor 5-504 is shown. In a graph 514, the voltage output by inverter 5-502 is shown, and a graph 516 shows the clock signal.

As shown, at a point 518, the voltage across capacitor 5-504 reaches the threshold voltage $V_{THR}$. At this point, switch 510 is closed and capacitor 5-504 discharges very quickly. This results in a pulse at 520. This pulse causes the clock signal to go low at 522. The process repeats itself at points 524, 526, and 528, except for at 528, the clock signal goes high instead of low. At each impulse, the clock signal goes from high to low, or low to high. This results in a clock signal with a 50% duty cycle. The frequency of the clock signal does not depend on the threshold voltage of inverter 502 and any delay in switching of inverter 502 does not affect the clock frequency.

As discussed above, in addition to particular embodiments generating a current $I_0$ proportional to $V_{THR}/R$, particular embodiments also provide a way to compensate for temperature dependence of an integrated or internal resistor. The compensation for the temperature dependence of the integrated resistor may be necessary because the current $I_0$ is proportional to the resistance of the internal resistor.

Figure 6A:
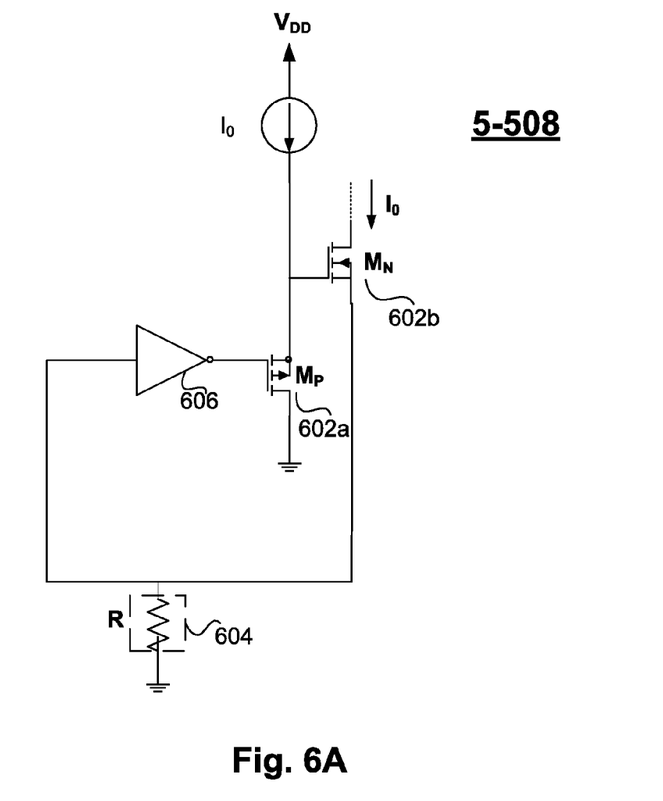
FIG. 6A depicts a more detailed example of a current source according to one embodiment.

FIG. 6A depicts a more detailed example of current generation circuit 5-508 according to one embodiment. A first metal oxide semiconductor (MOS) transistor 602a ($M_P$) and a second MOS transistor 602b ($M_N$) are provided. A gate of transistor 602b is coupled to the source of transistor 602a. Also, an internal resistor 604 and an inverter 606 are provided. The source of transistor 602b is coupled to resistor 604 and also to an input of inverter 606. An output of inverter 606 is coupled to a gate of transistor 602a.

Inverter 606 may have the same characteristics as inverter 5-502. That is, inverter 606 has the same threshold voltage $V_{THR}$. In this way, the current $I_o$ may be generated with a current proportional to the threshold voltage of inverter 5-502.

Figure 7:
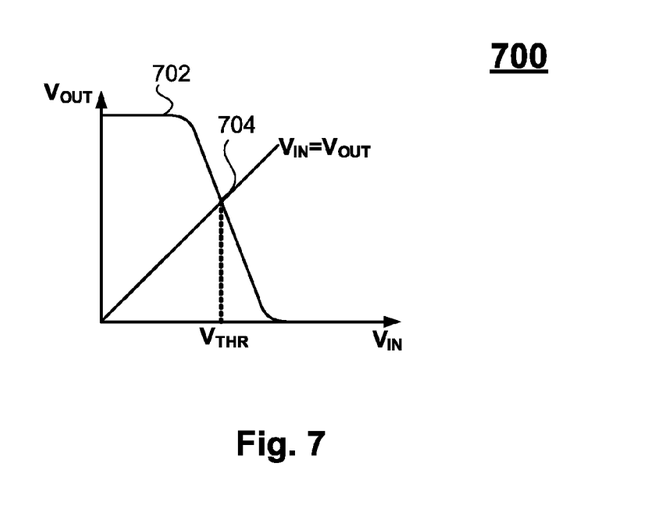
FIG. 7 shows the biasing of an inverter according to one embodiment.

In one embodiment, transistors 602a and 602b have their gate-source voltages equal to each other. This causes the input and output voltages of inverter 606 to be equal to each other because the output is biased by the gate-source voltage of transistor 602a and the input is biased by the gate-source voltage of transistor 602b. This means that inverter 606 is biased in the middle of its input-output characteristics. FIG. 7 shows the biasing of inverter 6-606 according to one embodiment. In a graph 700, a waveform 702 shows the input-output characteristics of inverter 6-606. Because the input and output voltages of inverter 6-606 are equal to each other, inverter 6-606 operates as an amplifier with a gain given by the slope of the input-output characteristic in a middle point of waveform 702 at a point 704.

Figure 6B:
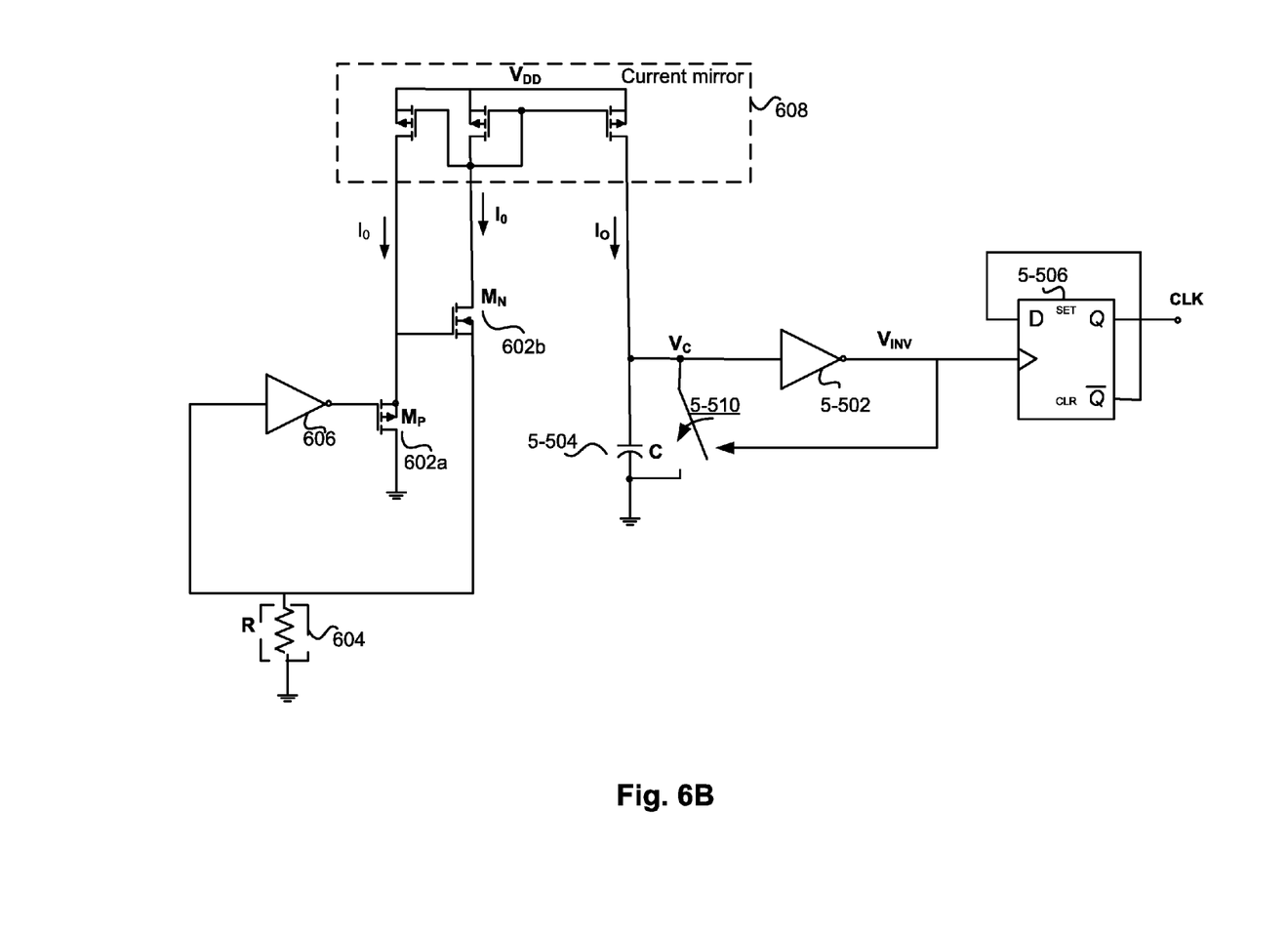
FIG. 6B shows an example of mirroring the current $I_0$ according to one embodiment.

Referring back to FIG. 6A, as a consequence of inverter 6-606 being biased at the middle point of its input-output characteristics, the voltage across resistor 604 is equal to the inverter threshold $V_{THR}$. Then, the current $I_0$ is equal to $I_0 = V_{THR}/R$. The current flows through transistor 602b and is then mirrored to transistor 602a, which charges capacitor 5-504. FIG. 6B shows an example of mirroring the current $I_0$ according to one embodiment. A current mirror 608 is provided to mirror the current $I_0$ to capacitor 5-504. In one example, current mirror 608 may be implemented using a PMOS current mirror. Other implementations of current mirrors may also be appreciated.

The frequency of the output clock signal is f=1/(2RC), where R is the resistance of the internal resistor 604 and C is the capacitance of capacitor 5-504. Both resistor 604 and capacitor 5-504 are integrated on the chip that includes RC oscillator 5-500. Because both resistor 604 and capacitor 5-504 are integrated on the chip, both vary with process and thus the output clock frequency also exhibits process sensitivity. However, the frequency variations due to the process variations can be trimmed out.

Capacitor 5-504 operates independently of temperature; however, resistor 604 operates differently depending on the temperature and thus the output frequency exhibits temperature sensitivity that may not be able to be trimmed out. Accordingly, particular embodiments may compensate for the temperature sensitivity of resistor 604.

Different ways of compensating for the temperature sensitivity may be provided. A temperature coefficient of resistor 604 encompasses the changes in temperature sensitivity for resistor 604. The changes may be compensated differently. A first method is when opposite signs of the temperature coefficient are available for two types of resistors. In complementary metal oxide semiconductor (CMOS) processes, different types of resistors are available, such as diffusion resistors, poly resistors, and N-well resistors. If two types of resistors with temperature coefficients of opposite signs are available, two resistors may be put in series with opposite temperature coefficients and proper values to achieve the temperature compensation. That is, the oppositely signed temperature coefficients may be canceled out.

Figure 8:
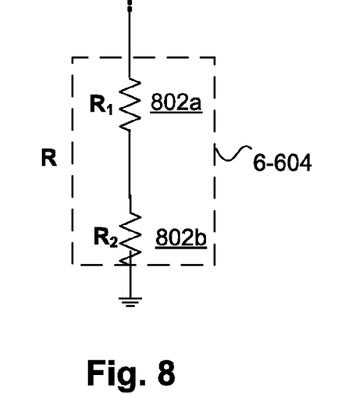
FIG. 8 shows an example of a resistor using two resistors in series according to one embodiment.

FIG. 8 shows an example of resistor 6-604 (R) using two resistors 802a ($R_1$) and 802b (R2) in series according to one embodiment. In this case, if $R=R+R_2$, where $R_1$ is a resistor with a positive temperature coefficient ($\alpha_1>0$) and $R_2$ is a resistor with a negative temperature coefficient ($\alpha_2<0$). Consequently, the dependence of resistors $R_1$ and $R_2$ on temperature is shown by $$\frac{\partial R}{\partial T} = \frac{\partial R_1}{\partial T} + \frac{\partial R_2}{\partial T} = R_{01}\alpha + R_{02}\alpha_2.$$

If $R_0=R_{01}+R_{02}$, where $R_{01}$, $R_{02}$, and $R_0$ are the values of $R_1$, $R_2$, and R at a reference temperature, the temperature coefficient of R is 0 if $$\frac{\partial R}{\partial T} = 0 --> R_{01}\alpha_1 = -R_{02}a_2 --> R_{02} = \frac{\alpha_1}{\alpha_1 + |\alpha_2|} R_0; R_{01} = \frac{|\alpha_2|}{\alpha_1 + |\alpha_2|} R_0$$

Once the resistance R is fixed according to the desired frequency to be generated and the two temperature coefficients $\alpha_1$ and $\alpha_2$ are known, the values of the two resistances $R_1$ and $R_2$ may be selected to achieve the temperature compensation. For example, the above formulas are used to select the values of $R_1$ and $R_2$. The temperature compensation allows for the desired clock frequency to be generated.

Figure 9:
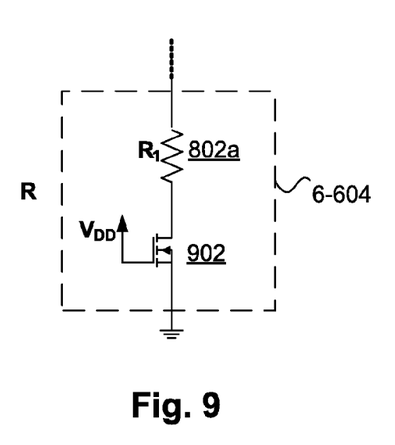
FIG. 9 shows an example of the resistor using a MOS transistor biased in the linear region according to one embodiment.

In some integrated circuit (IC) technologies, different types of resistors have temperature coefficients with the same sign. Thus, it is not possible to use different types of resistors to compensate for the temperature variations. That is, two resistors with opposite temperature coefficients may not be available. In this case, a MOS transistor in the linear or the saturation region may be used to achieve the temperature compensation. FIG. 9 shows an example of resistor 6-604 using a MOS transistor 902 biased in the linear region according to one embodiment. The use of MOS transistor 902 in which it is biased in the linear region as a resistor uses the equivalent resistance of the MOS transistor, $r_d$, which is given by $$r_d = \frac{1}{\mu C_{ox} W/L(V_{DD} - V_{TH})} \approx \frac{1}{\mu C_{ox} W/LV_{DD}} (\text{if } V_{DD} >> V_{TH}) \frac{1}{r_d} \frac{\partial r_d}{\partial T} =$$

$$\alpha_d = -\frac{1}{\mu}\frac{\partial \mu}{\partial T} > 0,$$

where $\mu$ is the electron mobility of transistor 902, $C_{ox}$ is the oxide capacitance of transistor 902, W/L are the width/length of the channel transistor 902, and $V_{TH}$ is the threshold voltage of transistor 902.

Since $\alpha_d$ is greater than 0 for transistor 902 when it operates in the linear region, the temperature coefficient is positive for transistor 902. A compensation scheme can be applied when the temperature coefficient of resistor 8-802a ($R_1$) is negative and the values of $R_1$ and $r_d$ are selected as explained above with respect to FIG. 8.

Figure 10:
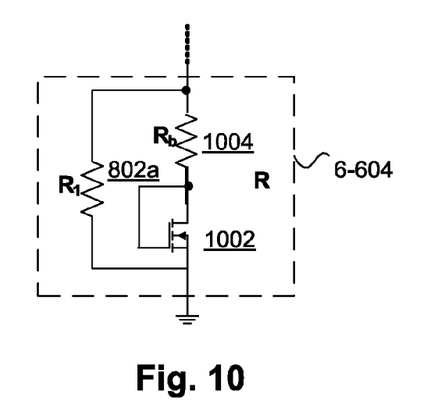
FIG. 10 shows an example of the resistor using a MOS transistor biased in the saturation region according to one embodiment.

In another example, all available resistors in IC technology may have positive temperature coefficients. In this case, the positive temperature coefficient of MOS transistor 902 may not be used because resistor $R_1$ may also have a positive temperature coefficient. In this case, a MOS transistor biased in the saturation region may be used. FIG. 10 shows an example of resistor 6-604 using a MOS transistor biased in the saturation region according to one embodiment. As shown, a MOS transistor 1002, a resistor 802a, and a resistor 1004 ($R_b$) are provided. Resistor 802a is in parallel with transistor 1002 and resistor 1004.

Transistor 1002 is biased in the saturation region to exploit the negative temperature coefficient of the threshold voltage to compensate for the positive temperature coefficient of resistors $R_1$ and $R_b$. $R_1$ is the integrated resistor with a positive temperature coefficient and $R_b$ is used to bias transistor 1002 in the saturation region with a gate-source voltage close to the threshold voltage so that the negative temperature coefficient in the threshold voltage is dominant with respect to the temperature coefficient of the mobility. In this case, the equivalent resistance $r_d$ of a diode-connected MOS transistor 1002 is $R_2=r_d+R_b$. Also, the temperature coefficient of transistor 1002 is $\alpha_2$. By biasing transistor 1002 with a proper gate-source voltage, the temperature coefficient $\alpha_d$ is negative. The gate-source voltage of transistor 1002 may be chosen so that the temperature coefficient of the series of $r_d$ and $R_b$ is negative compensating for the positive temperature coefficient of resistor $R_1$. If $R_2$ is the series equivalent resistance of transistor 1002 and resistor 1004 ($R_2=r_d R_b$) and $\alpha_2$ is the temperature coefficient of $R_2$, which is negative, then the resistance is $R=R_1||R_2$ and the temperature dependence is given by:

$$\frac{\partial R}{\partial T} = \frac{\left(R_2\frac{\partial R_1}{\partial T} + R_1\frac{\partial R_2}{\partial T}\right)(R_1+R_2) - R_1R_2\left(\frac{\partial R_1}{\partial T} + \frac{\partial R_2}{\partial T}\right)}{(R_1+R_2)^2} =$$

-continued $$\frac{\alpha_1 R_{01} R_2 + \alpha_2 R_{02} R_1}{R_1 + R_2} - \frac{R_1 R_2 (\alpha_1 R_{01} + \alpha_2 R_{02})}{(R_1 + R_2)^2}$$

Also, the temperature coefficient is zero if $$\alpha_1 R_{01} R_2{}^2 = |\alpha_2| R_{02} R_1{}^2.$$

Also, at the reference temperature, the following is found:

$$\alpha_1 R_{02} = |\alpha_2| R^{01}$$

$R_{01}$ and $R_{02}$ are the values of $R_1$ and $R_2$ at a reference temperature. $\alpha_2$ is thus negative. Once the resistance R is fixed according to the frequency that is desired to be generated, the two temperature coefficients $\alpha 1$ and $\alpha 2$ are known, the two resistance values R1 and R2 may be chosen to achieve the temperature compensation. The temperature compensation allows for the desired clock frequency to be generated.

Figure 11:
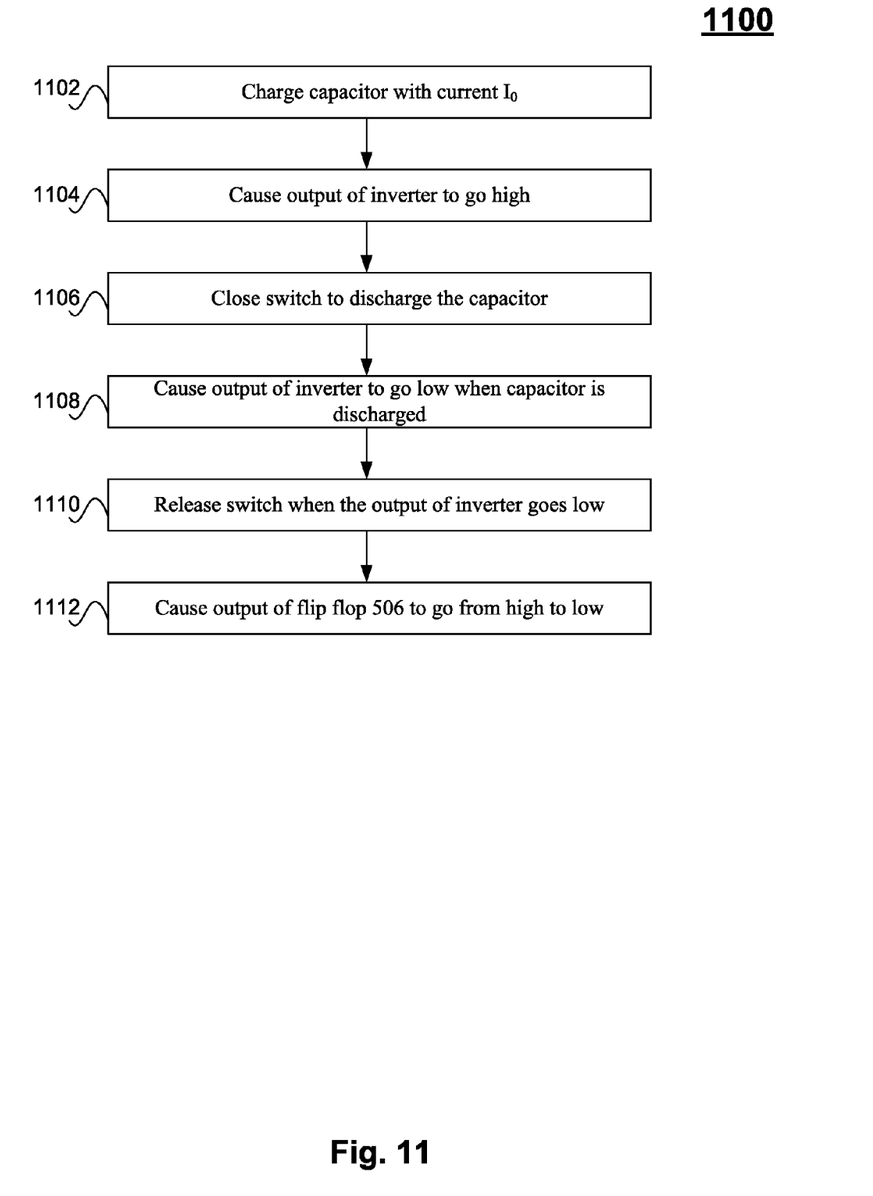
FIG. 11 depicts a simplified flowchart of a method according to one embodiment.

FIG. 11 depicts a simplified flowchart 1100 according to one embodiment. At 1102, a current $I_0$ charges capacitor 504. At 1102, the voltage across capacitor 5-504, when it reaches a threshold, $V_{THR}$, of inverter 502, causes the output of inverter 5-502 goes high. At 1106, switch 510 is closes, which discharges capacitor 5-504.

At 1108, once the capacitor is discharged, the output of inverter 5-502 goes low. At 1110, once the output of inverter goes low, switch 5-510 is released. At 1112, this causes the output of flip flop 506 to go from high to low. The process above repeats with the output of flip flop 506 going from low to high. This continues where a 50% duty cycle clock signal is output.

Accordingly, particular embodiments provide a high accuracy, low power, and low cost RC oscillator 5-500. In one embodiment, no external components and no op-amps are needed to implement RC oscillator 5-500. Accuracy is provided by compensating for the process, temperature, and supply voltage variations of the threshold of inverter 5-502, which is used as the comparator. Compensation of the temperature variations of the integrated resistor 604 also contributes to the accuracy. Additionally, the process variations of resistor 604 are trimmed out. Low power is achieved because the op-amp comparator and bandgap are not required. The low cost may be achieved because of the absence of external components.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A circuit comprising:
   a current generator configured to generate a current proportional to a comparator threshold voltage by a ratio, including an inverter configured to have an equal voltage at an input and an output to generate the comparator threshold voltage;
   a capacitor configured to be charged by the current to have a capacitor voltage;
   a comparator configured to compare the capacitor voltage with the comparator threshold voltage;
   a switch configured to discharge the capacitor based on the comparison; and
   a clock generator logic configured to generate a clock signal based on the comparison, such that a frequency of the clock signal is a function of the ratio and is independent of the current and the comparator threshold voltage.

2. The circuit of claim 1, wherein the current generator further comprises:
   a resistor module with the comparator threshold voltage applied on the resistor module.

3. The circuit of claim 2, wherein the resistor module comprises:
   a first resistance portion configured to have a positive temperature coefficient; and
   a second resistance portion in series with the first resistance portion, the second resistance portion being configured to have a negative temperature coefficient.

4. The circuit of claim 2, wherein the resistor module comprises:
   a metal-oxide-semiconductor transistor configured to have a turn-on resistance of a negative temperature coefficient.

5. The circuit of claim 1, wherein the inverter is a first inverter and the comparator includes a second inverter configured to receive the capacitor voltage as an input.

6. The circuit of claim 1, wherein the current generator, the capacitor, the comparator, the switch and the clock generator logic are implemented on a single integrated circuit (IC) chip.

7. A method, comprising:
   equalizing a voltage level at an input and an output of an inverter to generate a comparator threshold voltage;
   generating a current proportional to the comparator threshold voltage by a ratio;
   charging a capacitor by the current to generate a capacitor voltage;
   comparing the capacitor voltage with the comparator threshold voltage;
   discharging the capacitor when the comparison indicates the capacitor voltage is larger than the comparator threshold voltage; and
   generating a clock signal based on the comparison, such that a frequency of the clock signal is a function of the ratio and is independent of the current and the comparator threshold voltage.

8. The method of claim 7, wherein generating the current proportional to the comparator threshold voltage further comprises:
   applying the comparator threshold voltage on a resistor module.

9. The method of claim 8, further comprising:
   combining a first resistance portion having a positive temperature coefficient with a second resistance portion having a negative temperature coefficient in the resistor module.

10. The method of claim 8, further comprising:
    using a metal-oxide-semiconductor transistor configured to have a turn-on resistance of a negative temperature coefficient in the resistor module.

11. The method of claim 7, wherein comparing the capacitor voltage with the comparator threshold voltage further comprises:
    providing the capacitor voltage as an input to a second inverter.

12. An apparatus comprising:
- a current generator configured to generate a current proportional to a comparator threshold voltage by a ratio, including an inverter configured to have an equal voltage at an input and an output to generate the comparator threshold voltage;
- a capacitor configured to be charged by the current to have a capacitor voltage;
- a comparator configured to compare the capacitor voltage with the comparator threshold voltage;
- a switch configured to discharge the capacitor based on the comparison; and
- a clock generator logic configured to generate a clock signal based on the comparison, such that a frequency of the clock signal is a function of the ratio and is independent of the current and the comparator threshold voltage.

13. The apparatus of claim 12, wherein the current generator further comprises:
- a resistor module with the comparator threshold voltage applied on the resistor module.

14. The apparatus of claim 13, wherein the resistor module comprises:
- a first resistance portion configured to have a positive temperature coefficient; and
- a second resistance portion in series with the first resistance portion, the second resistance portion being configured to have a negative temperature coefficient.

15. The apparatus of claim 13, wherein the resistor module comprises:
- a metal-oxide-semiconductor transistor configured to have a turn-on resistance of a negative temperature coefficient.

16. The apparatus of claim 12, wherein the inverter is a first inverter and the comparator includes a second inverter configured to receive the capacitor voltage as an input.

17. The apparatus of claim 12, wherein the current generator, the capacitor, the comparator, the switch and the clock generator logic are implemented on a single integrated circuit (IC) chip.

* * * * *